United States Patent
Algotsson et al.

(10) Patent No.: US 7,495,312 B2
(45) Date of Patent: Feb. 24, 2009

(54) METHOD FOR PRODUCING VERTICAL BIPOLAR TRANSISTORS AND INTEGRATED CIRCUIT

(75) Inventors: Patrick Algotsson, Stockholm (SE); Hans Norström, Solna (SE); Karin Andersson, Haesselby (SE)

(73) Assignee: Infineon Technologies AG, Munich (DE)

( * ) Notice: Subject to any disclaimer, the term of this patent is extended or adjusted under 35 U.S.C. 154(b) by 416 days.

(21) Appl. No.: 11/241,807

(22) Filed: Sep. 30, 2005

(65) Prior Publication Data

US 2006/0076645 A1    Apr. 13, 2006

(30) Foreign Application Priority Data

Sep. 30, 2004    (EP)    ................................. 04023345

(51) Int. Cl.
*H01L 27/082* (2006.01)
*H01L 21/8222* (2006.01)

(52) U.S. Cl. ............................. 257/566; 257/E27.055; 257/E27.056; 438/340; 438/342

(58) Field of Classification Search ................. 257/511, 257/525, 526, 552, 553, 555, 566, 574, E27.055, 257/E27.056, E27.057; 438/311, 322, 340, 438/342
See application file for complete search history.

(56) References Cited

U.S. PATENT DOCUMENTS

| | | | |
|---|---|---|---|
| 5,698,459 A | 12/1997 | Grubisich et al. | |
| 6,004,855 A | 12/1999 | Pollock et al. | |
| 6,521,974 B1 * | 2/2003 | Oda et al. | 257/593 |
| 6,724,066 B2 * | 4/2004 | Swanson et al. | 257/557 |
| 6,770,952 B2 * | 8/2004 | Babcock et al. | 257/565 |
| 6,838,348 B2 * | 1/2005 | Babcock et al. | 438/311 |
| 7,001,806 B2 * | 2/2006 | Tilke et al. | 438/202 |
| 2002/0158309 A1 | 10/2002 | Swanson et al. | |
| 2003/0094673 A1 | 5/2003 | Dunn et al. | |
| 2004/0048428 A1 | 3/2004 | Tanomura | |

OTHER PUBLICATIONS

Gilbert et al., "Quasi-Dielectrically Isolated Bipolar Junction Transistor with Subcollector Fabricated Using Silicon Selective Epitaxy", IEEE Transactions on Electron Devices, New York, vol. 38, No. 7, Jul. 1991, pp. 1660-1665, (6 pages).

Heinemann et al., "Novel Collector Design for High-Speed SiGe: C HBTs", International Electron Devices Meeting 2002, Technical Digest, 2002, pp. 775-778, (4 pages).

* cited by examiner

*Primary Examiner*—M. Wilczewski
(74) *Attorney, Agent, or Firm*—Maginot, Moore & Beck

(57) ABSTRACT

A method for producing vertical bipolar transistors having different voltage breakdown and high-frequency performance characteristics on a single die comprises forming, for each of the vertical bipolar transistors, a buried collector region, and base and emitter regions above the buried collector region. The lateral extensions and locations of the base and emitter regions and of the buried collector region are, for each of the vertical bipolar transistors, selected to create an overlap between the base and emitter regions, and the buried collector region, as seen from above, wherein at least some of the overlaps are selected to be different.

4 Claims, 5 Drawing Sheets

METHOD FOR PRODUCING VERTICAL BIPOLAR TRANSISTORS AND INTEGRATED CIRCUIT

CROSS-REFERENCE TO RELATED APPLICATIONS

This application claims priority from European Patent Application No. 04023345.5, which was filed on Sep. 30, 2004, and is incorporated herein by reference in its entirety.

BACKGROUND OF THE INVENTION

1. Field of the Invention

The present invention relates to a method for producing vertical bipolar transistors having different voltage breakdown and high-frequency performance characteristics on a single die. The invention also relates to an integrated circuit comprising transistors of the above kind.

2. Description of the Related Art

Advanced silicon bipolar or BiCMOS processes are used to manufacture high-performance high-frequency circuits, commonly used for radio and analogue functions in mobile wireless devices such as base stations for cellular networks, mobile and wireless phones, wireless networking for computers etc. The bipolar transistors have good high-frequency and analogue performance, high gain, and are excellent for driving large currents. The CMOS technology is preferably used for logic, and thus the combined BiCMOS technology is an excellent choice for mixed-signal systems.

In high-frequency bipolar and BiCMOS processes, the bipolar transistor is implemented as a vertical device. The collector contact is placed at the side of the emitter/base structure. A buried collector, or subcollector, is used to achieve a low-ohmic path for the collector current from the active device via a highly doped vertical sinker to the collector contact. A common manner to form a buried collector is by doping the semiconductor substrate to high levels using preferably a patterned oxide mask, and then an epitaxial layer of silicon is grown on the substrate and the remaining parts of the transistor—base, emitter and collector contact—are formed on the top of the epitaxial layer.

The collector-to-base and collector-to-emitter breakdown voltages ($BV_{cbo}$, $BV_{ces}$, $BV_{ceo}$) are important device parameters. The breakdown voltages depend on the thickness and doping of the lowly doped collector epitaxial layer. For the breakdown voltage $BV_{ceo}$, the current gain of the transistor is also involved, but the gain is set essentially by the emitter and base properties. As reach-through normally occurs prior to avalanche breakdown in the base-collector diode, the buried collector will affect the voltage breakdown. The distance between the buried collector and the base must be made short to insure good high-frequency performance and low collector resistance. However, the requested supply voltage will determine the minimum distance and thus affect the high-frequency performance. The trade-off between breakdown voltage and frequency performance in transistors is called the Johnson limit.

In a typical mixed-signal circuit design, not all the bipolar devices need to be optimized for best frequency performance. Some devices may instead need higher breakdown voltages, such as transistors used for switching current or used in interfaces to other circuits. However, simultaneous manufacturing of devices with high breakdown voltage and devices with good high-frequency performance on a single chip is not easily done without increased process complexity and increased costs associated therewith.

U.S. Patent Application No. 2003/0094673 by Dunn et al., discloses a solution to this problem by using two different impurity types, arsenic and antimony, and different concentrations for the buried collector. This approach requires additional process steps as well as additional photo masks.

U.S. Pat. No. 6,770,952 by Babcock et al., discloses the manufacturing of devices with different collector design on a single wafer. However, the solution utilizes thin silicon-on-insulator (SOI) technology, and can not be used in conventional BiCMOS technology on bulk wafers.

SUMMARY OF THE INVENTION

In accordance with a first aspect, the present invention provides a method for producing vertical bipolar transistors having different voltage breakdown and high-frequency performance characteristics on a single die, with the steps of forming, for each of the vertical bipolar transistors, a buried collector region, and base and emitter regions above the buried collector region, wherein for a first vertical transistor the emitter region, the base region and the buried collector region are arranged such that there is no overlap between the emitter region and the buried collector region, and such that there is at least a partial overlap between the base region and the buried collector region, whereby the buried collector region is laterally separated from the emitter region, and wherein for a second vertical transistor the emitter region, the base region and the buried collector region are arranged such that there is at least a partial overlap between the base region and the buried collector region.

In accordance with a second aspect, the present invention provides an integrated circuit with vertical bipolar transistors having different voltage breakdown and high-frequency performance characteristics, wherein the vertical bipolar transistors comprise each base and emitter regions above a buried collector region, wherein for a first vertical transistor the emitter region, the base region and the buried collector region are arranged such that there is no overlap between the emitter region and the buried collector region, and such that there is at least a partial overlap between the base region and the buried collector region, whereby the buried collector region is laterally separated from the emitter region, and wherein for a second vertical transistor the emitter region, the base region and the buried collector region are arranged such that there is at least a partial overlap between the base region and the buried collector region.

The present invention discloses a method to increase the breakdown voltage by using different collector layouts for different transistors on the very same die or chip. This makes it possible to optimise RF performance for a fixed breakdown voltage and offers, together with conventional design, the possibility of several levels of supply voltage on the same die. The inventive method will not cause any increase in the process complexity since only the mask layout of the devices are affected.

The conventional method to form the buried collector is to let the collector region expand under the complete device or, in some cases, under the complete active area or emitter-base area.

According to an aspect of the present invention there is provided a method comprising the steps of forming, for each of the vertical bipolar transistors fabricated on a single die, a buried collector region, and base and emitter regions above the buried collector region. For each of the vertical bipolar transistors, the lateral extensions and locations of the base and emitter regions, and of the buried collector region are selected to create an overlap between the base and emitter regions, and the buried collector region, as seen from above, and at least some of the overlaps are selected to be different.

It has been found that the location and lateral extension of the buried collector region with respect to the base and emitter regions strongly affect the voltage breakdown and high-frequency performance characteristics. Also the collector resistance is affected.

Thus by selecting the lateral extension and the location of the buried collector region for a given transistor, a desired trade-off between voltage breakdown and high-frequency performance characteristics can be obtained.

Preferably, some of the vertical bipolar transistors may each have a buried collector region comprising two laterally separated portions arranged on either side of a symmetry plane of the transistor. The portions are connected to one another at an end of the transistor lying outside of the base/emitter regions. Hereby an increased breakdown voltage is obtained to the cost of deteriorated high-frequency performance.

Additionally or alternatively, some of the vertical bipolar transistors may each have a buried collector region arranged on one side only of a symmetry plane of the transistor, leaving a main portion of the transistor without the buried collector region. This will further increase the reach-through voltage and hence improve the voltage capability.

The methods of the present invention are preferably implemented in BiCMOS processes or in bipolar only processes.

Further characteristics of the invention and advantages thereof will be evident from the detailed description of preferred embodiments of the present invention given hereinafter and the accompanying FIGS. 1-5, which are given by way of illustration only, and thus, are not limitative of the present invention.

BRIEF DESCRIPTION OF THE DRAWINGS

Preferred embodiments of the present invention are explained in more detail in the following with reference to the accompanying drawings, in which.

Identical reference numerals are used throughout the Figures to indicate similar components and parts.

DESCRIPTION OF THE PREFERRED EMBODIMENTS

Figure 1A:
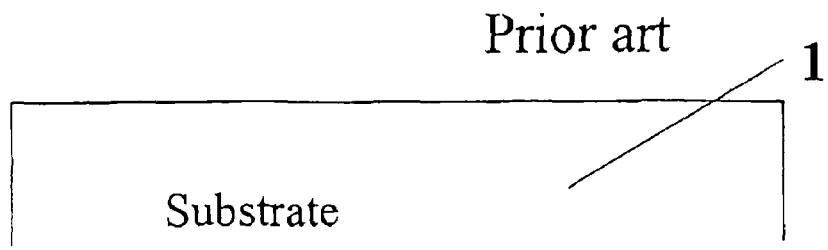
FIGS. 1a-d are highly enlarged schematic cross-sectional views of a portion of a semiconductor structure during processing according to prior art.
Figure 1B:
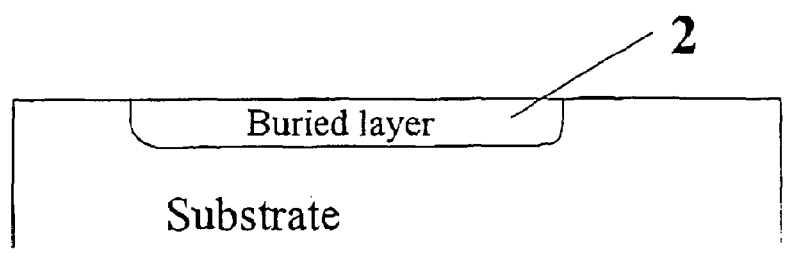
Figure 1C:
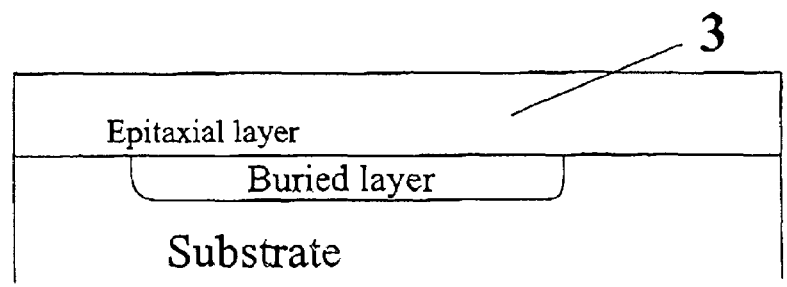

In order to understand the present invention various embodiments will be described. It will be apparent to one skilled in the art that the invention may be practiced in other embodiments that depart from those explicitly disclosed. In other instances, detailed descriptions of methods well-known to one skilled in the art are omitted.

A prior art method in the fabrication of a vertical bipolar NPN transistor is illustrated in FIGS. 1a-d. A P-type doped bulk substrate 1 is provided, a buried collector layer region 2 is formed by ion implantation, a doped epitaxial semiconductor layer 3 is formed thereon, a base layer region including an extrinsic base layer region 4 and an intrinsic base layer region 6 is formed in the doped epitaxial semiconductor layer 3 above the buried collector layer region 2, an emitter layer region 5 is formed in the intrinsic base layer region 6, and a highly doped sinker or contact 7 is formed in the doped epitaxial semiconductor layer 3 to obtain an electric contact to the buried collector layer region 2.

Figure 1D:
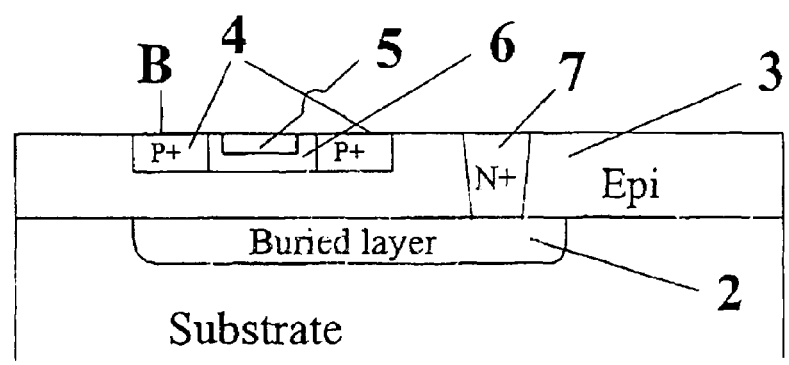
Figure 2A:
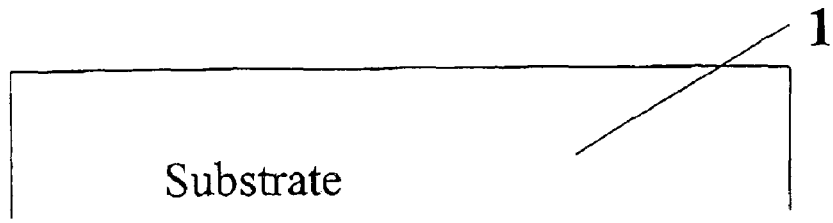
FIGS. 2a-d, 3a-d, 4a-d, and 5a-d are highly enlarged schematic cross-sectional views of a portion of a semiconductor structure during processing according to different embodiments of the present invention.
Figure 2B:
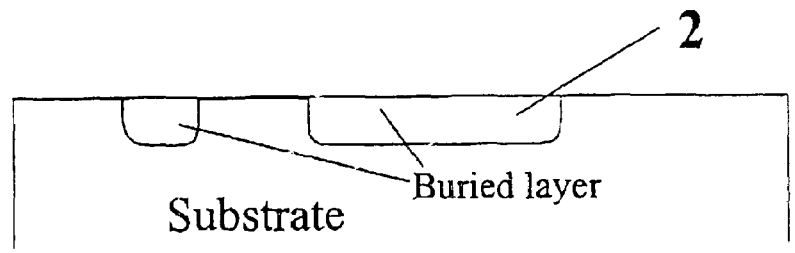
Figure 2C:
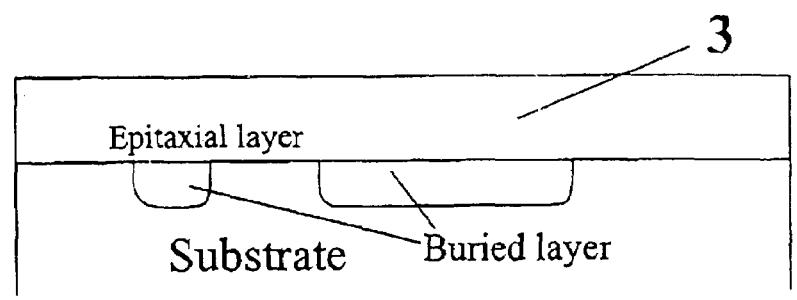
Figure 2D:
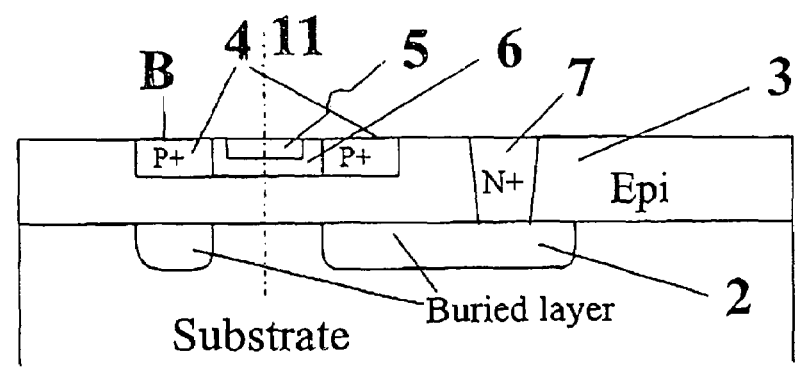
Figure 3A:
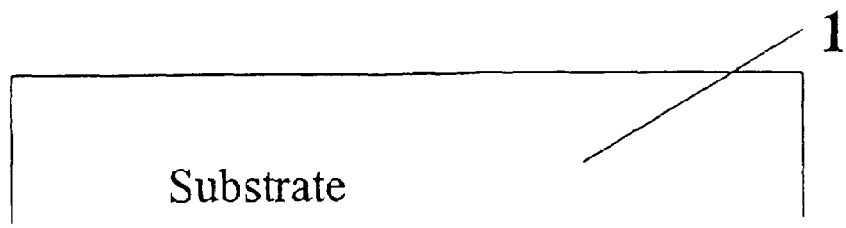
Figure 3B:
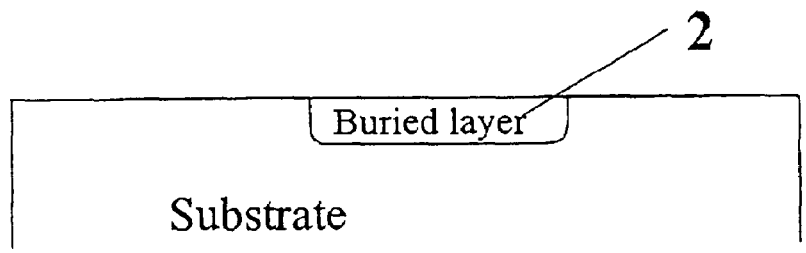
Figure 3C:
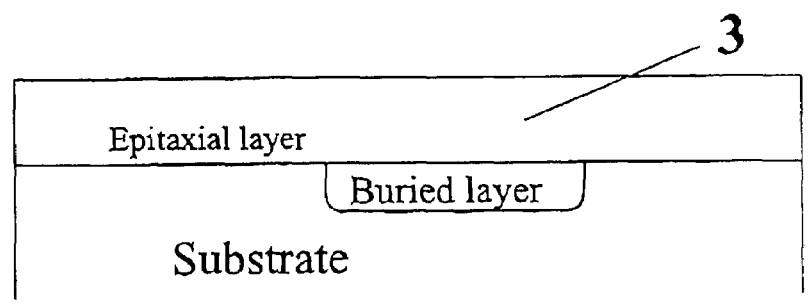
Figure 3D:
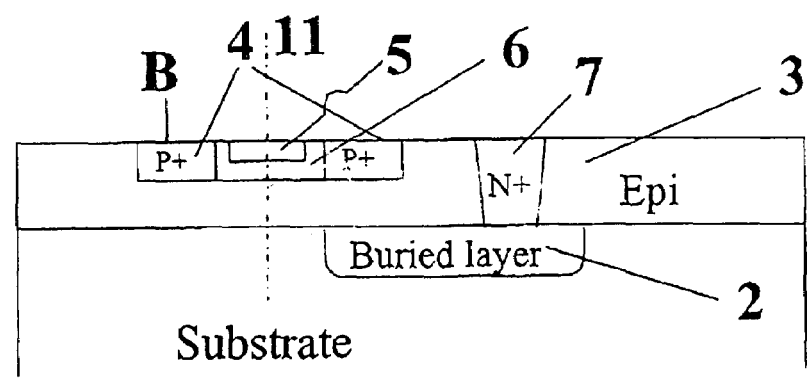
Figure 4A:
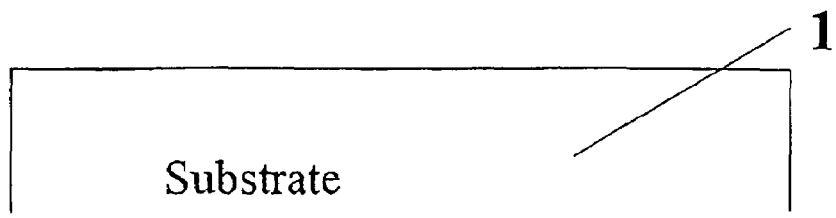
Figure 4B:
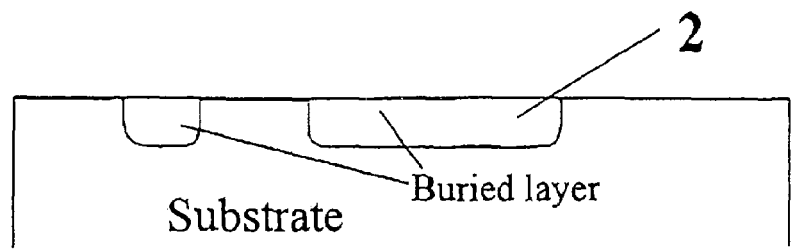
Figure 4C:
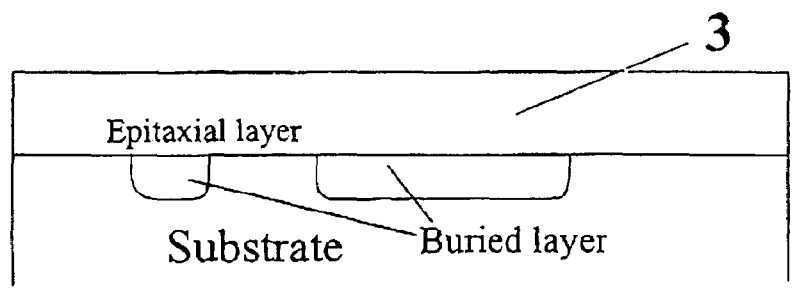
Figure 4D:
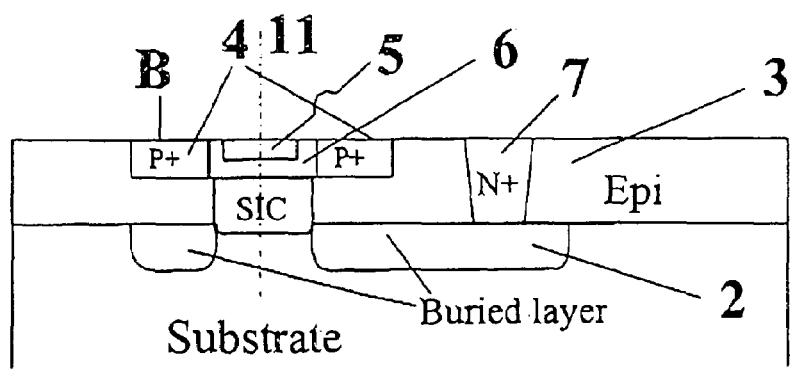

The lateral extensions and locations of the base 4, 6 and emitter 5 layer regions, and of the buried collector layer region 2 are selected, as seen in FIG. 1d, to create an overlap between the base 4, 6 and emitter 5 layer regions, and the buried collector layer region 3, as seen from above. The overlap extends essentially along the complete extension of the base 4, 6 and emitter 5 layer regions, i.e. the buried collector layer region 3 is basically present beneath the entire transistor.

Such a bipolar transistor can be designed to have excellent high frequency performance and very low collector resistance. However, such a design does not provide for optimum breakdown voltage capabilities.

The present invention remedies this problem, and a first embodiment thereof is described below with reference to FIGS. 2a-d and FIGS. 1a-d.

At least two vertical bipolar transistors are fabricated simultaneously on a single die where the two vertical bipolar transistors have different voltage breakdown and high-frequency performance characteristics. A first one of the transistors is fabricated in accordance with FIGS. 1a-d, whereas a second one is fabricated in accordance with FIGS. 2a-d.

The buried collector layer region 2 for the second transistor is formed by ion implantation in the substrate 1.

A mask is applied having openings so that the buried collector layer region 2 comprises two laterally separated portions, which are connected at an end of the transistor located along the normal of the plane of the cross-section of FIGS. 2a-d. Thus, given a linear transistor layout, the mask may have the general shape of a U (if the separated portions are connected to each other at one end only) or may be generally ring-shaped (if the separated portions are connected to each other at two opposite ends). The buried collector layer regions 2 of all the bipolar transistors of the same doping type on the die are of course formed simultaneously.

Then, the doped epitaxial semiconductor layer 3 is deposited as disclosed with reference to FIGS. 1a-d. A base layer region including an extrinsic base layer region 4 and an intrinsic base layer region 6 for the second transistor is formed in the doped epitaxial semiconductor layer 3 above the buried collector layer region 2 of the second transistor, an emitter layer region 5 is formed in the intrinsic base layer region 6 of the second transistor, and a highly doped sinker or contact 7 is formed in the doped epitaxial semiconductor layer 3 to obtain an electric contact to the buried collector layer region 2 of the second transistor.

The emitter layer region 5 of the second transistor is advantageously symmetric with respective to a vertical plane schematically indicated by 11, wherein the two laterally separated portions of the buried collector layer region 2 are arranged on either side of the vertical plane 11.

The buried collector layer region 2 of the second transistor is selected to be laterally essentially separated from the emitter layer region 5, and optionally from the intrinsic base layer region 6, of the second transistor.

The second transistor, which thus has no buried collector directly under the emitter layer region 5, has an increased breakdown voltage to the cost of deteriorated high frequency performance.

Generally, different vertical bipolar transistors may be manufactured on the same die, which have different layouts of their buried collector layer regions. Each transistor can generally be tailored, by selecting the lateral extension and the location of its buried collector layer region, to obtain a transistor having a desired trade-off between voltage breakdown and high-frequency performance characteristics.

Fabricated test structures have shown an increased breakdown voltage already for very short distances between the two separated buried collector layer region portions.

A second embodiment of the present invention is described with reference to FIGS. 3a-d. At least two vertical bipolar transistors are fabricated simultaneously on a single die where the two vertical bipolar transistors have different voltage breakdown and high-frequency performance characteristics. A first one of the transistors is fabricated in accordance with FIGS. 1a-d or according to FIGS. 2a-d, whereas a second one is fabricated in accordance with FIGS. 3a-d.

The transistor of FIGS. 3a-d is fabricated similar to the transistor of FIG. 2a-d. However, the buried collector layer region 2 is formed only at one side of the vertical symmetry plane 11. This layout is particularly an option for a transistor having a sinker or collector contact 7 only at one side of the transistor as being illustrated in FIG. 3d. By this embodiment, the breakdown voltage is increased even further.

A third embodiment of the present invention comprises the simultaneous manufacturing of at least two vertical bipolar transistors on a single die, where the two vertical bipolar transistors have different voltage breakdown and high-frequency performance characteristics. A first one of the transistors is fabricated in accordance with FIGS. 1a-d, in accordance with FIGS. 2a-d, or in accordance with FIGS. 3a-d, whereas a second one is fabricated in accordance with FIGS. 4a-d.

The transistor of FIGS. 4a-d is fabricated similar to the transistor of FIG. 2a-d. However, the collector comprises a selectively implanted collector (SIC). The SIC implant is formed beneath the intrinsic base preferably in contact with the buried collector layer region 2.

In this case the buried collector layer region 2 will have a major impact on both the breakdown and the Early voltage also if the buried collector layer region 2 reaches the edge of the active emitter/base region, as seen from above. The closer the buried collector layer region 2 gets to the emitter/base region, the less impact it will have on the increase of the collector resistance.

Finally, with reference to FIGS. 5a-d a fourth embodiment of the invention will be described.

At least two vertical bipolar transistors are fabricated simultaneously on a single die where the two vertical bipolar transistors have different voltage breakdown and high-frequency performance characteristics. The transistors are fabricated on a silicon-on-insulator (SOI) substrate.

A first one of the transistors is fabricated similar to FIGS. 1a-d, whereas a second one is fabricated similar to FIGS. 2a-d, but with the difference that the transistors are formed on the SOI substrate.

Figure 5A:
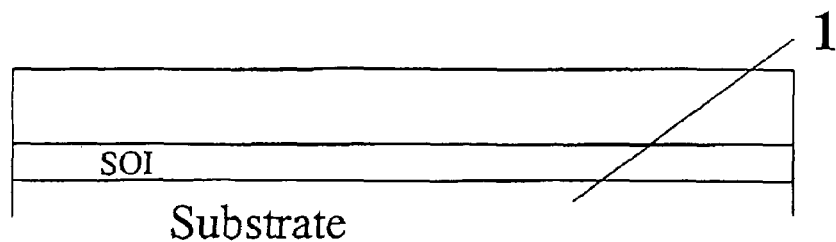
Figure 5B:
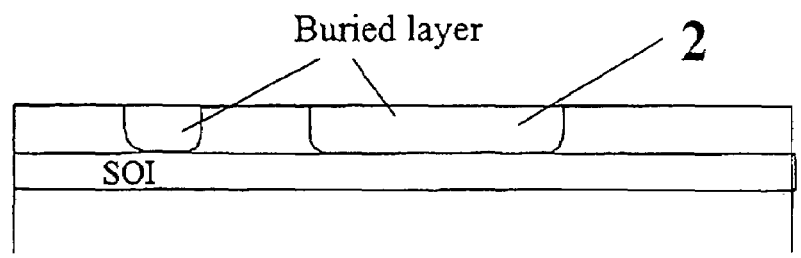
Figure 5C:
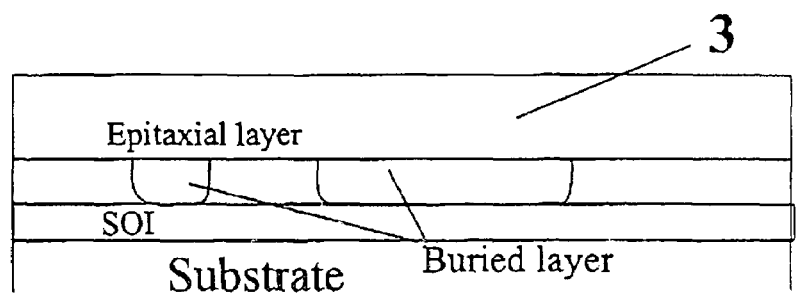

A P-type substrate with buried oxide layer (SOI) 1 is provided and buried collector layer regions for the transistors are formed, the buried collector layer region for the second transistor being shown as detail 2 in FIG. 5b. A doped epitaxial semiconductor layer 3 is formed thereon, and base layer regions, emitter layer regions, and sinkers or collector contacts for the two transistors are formed in the doped epitaxial semiconductor layer 3.

Figure 5D:
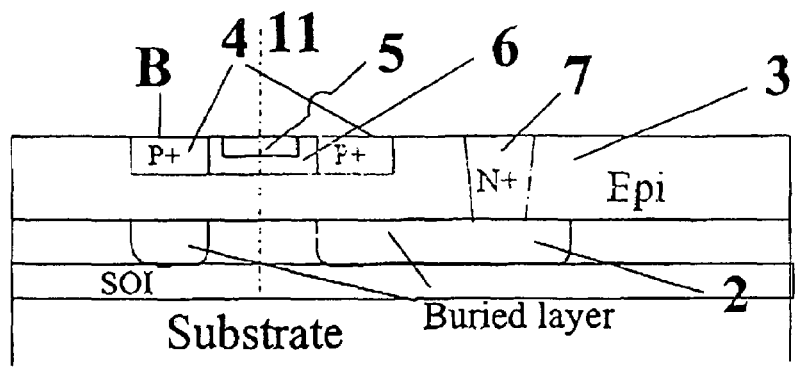

The lateral extensions and locations of the base and emitter layer regions and of the buried collector layer region of the first transistor are selected to create an overlap between the base and emitter layer regions, and the buried collector layer region similar to the overlap shown in FIG. 1d. The lateral extensions and locations of the base 4, 6 and emitter 5 layer regions, and of the buried collector layer region 2 of the second transistor are selected, as seen in FIG. 5d, to create an overlap between the base 4, 6 and emitter 5 layer regions, and the buried collector layer region 3 similar to the overlap shown in FIG. 2d.

In general the SOI substrate base embodiment will have the same advantages as the previously described embodiments have. It shall be understood by a person skilled in the art that transistors similar to those of FIGS. 3a-d and 4a-d may be formed together with other transistors on an SOI substrate.

By using the SOI substrate-based embodiment, the collector resistance can be kept very low while the breakdown voltage is increased.

It shall be appreciated that isolation structures such as e.g. deep trenches, may be formed to surround each of the transistors in any of the above embodiments.

While the embodiments above can be implemented in an existing BiCMOS or bipolar only process without other changes than that of the collector design, the increased breakdown and/or Early voltage can be used to increase the margin for other parameters by changing other process steps.

Generally, the present invention increases the flexibility for trade-off between many parameters such as breakdown voltage, Early voltage, current gain, cut-off frequency and collector resistance.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An integrated circuit comprising:
a first vertical bipolar transistor including a base region, an emitter region and a buried collector region, wherein for the first vertical bipolar transistor the emitter region, the base region and the buried collector region are arranged such that there is no overlap between the emitter region and the buried collector region, and such that there is at least a partial overlap between the base region and the buried collector region, wherein the buried collector region is laterally separated from the emitter region, and
a second vertical bipolar transistor including a base region, an emitter region and a buried collector region, wherein for the second vertical bipolar transistor the emitter region, the base region and the buried collector region are arranged such that there is at least a partial overlap between the base region and the buried collector region,
wherein the emitter region for the first vertical bipolar transistor is symmetric with respect to a vertical plane, and the buried collector region for the first vertical bipolar transistor is arranged only at one side of said vertical plane.

2. An integrated circuit comprising:
a first vertical bipolar transistor including a base region, an emitter region and a buried collector region, wherein for the first vertical bipolar transistor the emitter region, the base region and the buried collector region are arranged such that there is no overlap between the emitter region and the buried collector region, and such that there is at least a partial overlap between the base region and the buried collector region, wherein the buried collector region is laterally separated from the emitter region, and
a second vertical bipolar transistor including a base region, an emitter region and a buried collector region, wherein for the second vertical bipolar transistor the emitter region, the base region and the buried collector region are arranged such that there is at least a partial overlap between the base region and the buried collector region, wherein for the second vertical bipolar transistor the emitter region, the base region and the buried collector region are arranged such that there is no overlap between the emitter region and the buried collector region.

3. An integrated circuit comprising:

a first vertical transistor including a base region, an emitter region and a buried collector region; wherein the emitter region, the base region and the buried collector region of the first vertical transistor are arranged such that there is no overlap between the emitter region and the buried collector region, and such that there is at least a partial overlap between the base region and the buried collector region; and a second vertical transistor including a base region, an emitter region and a buried collector region; wherein the base region and the buried collector region of the second vertical transistor are arranged such that there is at least a partial overlap between the base region and the buried collector region, wherein the emitter region of the first vertical transistor is symmetric with respect to a vertical plane, and the buried collector region of the first bipolar transistor is arranged only at one side of said vertical plane.

4. An integrated circuit comprising:

a first vertical transistor including a base region, an emitter region and a buried collector region; wherein the emitter region, the base region and the buried collector region of the first vertical transistor are arranged such that there is no overlap between the emitter region and the buried collector region, and such that there is at least a partial overlap between the base region and the buried collector region; and a second vertical transistor including a base region, an emitter region and a buried collector region; wherein the base region and the buried collector region of the second vertical transistor are arranged such that there is at least a partial overlap between the base region and the buried collector region, wherein the emitter region, the base region and the buried collector region of the second vertical transistor are arranged such that there is no overlap between the emitter region and the buried collector region.

* * * * *